(12) United States Patent
Matsumoto et al.

(10) Patent No.: US 8,587,707 B2
(45) Date of Patent: Nov. 19, 2013

(54) DA CONVERTER AND SOLID-STATE IMAGING DEVICE THAT PROVIDES REDUCED POWER CONSUMPTION

(75) Inventors: Shizunori Matsumoto, Kanagawa (JP); Chikao Miyazaki, Nagasaki (JP)

(73) Assignee: Sony Corporation, Tokyo (JP)

( * ) Notice: Subject to any disclaimer, the term of this patent is extended or adjusted under 35 U.S.C. 154(b) by 193 days.

(21) Appl. No.: 12/845,224

(22) Filed: Jul. 28, 2010

(65) Prior Publication Data

US 2011/0050967 A1 Mar. 3, 2011

(30) Foreign Application Priority Data

Aug. 28, 2009 (JP) ................................. 2009-198869

(51) Int. Cl.
*H04N 3/14* (2006.01)
(52) U.S. Cl.
USPC ............ 348/294; 348/308; 341/144; 341/159
(58) Field of Classification Search
None
See application file for complete search history.

(56) References Cited

U.S. PATENT DOCUMENTS

| | | | | | |
|---|---|---|---|---|---|
| 5,293,166 | A | * | 3/1994 | Ta | 341/118 |
| 5,592,167 | A | * | 1/1997 | Caruso et al. | 341/159 |
| 5,703,582 | A | * | 12/1997 | Koyama et al. | 341/120 |
| 5,706,006 | A | * | 1/1998 | Hattori | 341/144 |
| 5,801,653 | A | * | 9/1998 | Liu et al. | 341/136 |
| 6,072,415 | A | * | 6/2000 | Cheng | 341/144 |
| 6,281,525 | B1 | * | 8/2001 | Krijn et al. | 257/99 |
| 6,281,825 | B1 | * | 8/2001 | Lee | 341/144 |
| 6,353,402 | B1 | * | 3/2002 | Kanamori | 341/118 |
| 6,363,402 | B1 | * | 3/2002 | Matsuura | 1/1 |
| 6,741,195 | B1 | * | 5/2004 | Cho | 341/136 |
| 2002/0186156 | A1 | * | 12/2002 | Inagaki et al. | 341/144 |
| 2005/0195238 | A1 | | 9/2005 | Eguchi et al. | |
| 2005/0195304 | A1 | * | 9/2005 | Nitta et al. | 348/308 |

FOREIGN PATENT DOCUMENTS

| JP | 11-261420 | 9/1999 |
|---|---|---|
| JP | 2005-323331 | 11/2005 |

* cited by examiner

*Primary Examiner* — Nicholas Giles
*Assistant Examiner* — Abdelaaziz Tissire
(74) *Attorney, Agent, or Firm* — Oblon, Spivak, McClelland, Maier & Neustadt, L.L.P.

(57) ABSTRACT

A DA converter includes: a reference current generating circuit that generates a reference current; current sources that supply currents according to the reference current; a voltage output circuit that outputs a voltage according to a current to be supplied thereto; switch circuits provided for the current sources respectively to each switch a connection of each of the current sources to the voltage output circuit or a predetermined load; a control section that controls the switch circuits based on an input digital signal to select that of the current sources which is to be connected to the voltage output circuit, and outputs a voltage according to the digital signal from the voltage output circuit; and a switch that stops an operation of at least one of the current sources based on a control signal from the control section, without stopping an operation of the reference current generating circuit.

10 Claims, 6 Drawing Sheets

DA CONVERTER AND SOLID-STATE IMAGING DEVICE THAT PROVIDES REDUCED POWER CONSUMPTION

BACKGROUND OF THE INVENTION

1. Field of the Invention

The present invention relates to a DA converter and a solid-state imaging device. More particularly, the invention relates a current-controlled DA converter, and a solid-state imaging device equipped therewith.

2. Description of the Related Art

There is a current-controlled DA (Digital-Analog) converter. This current-controlled DA converter is also called a current-added DA converter (see, for example, JP-A-11-261420 (Patent Document 1)).

FIGS. 11A and 11B are simple circuit diagrams of current-controlled DA converters. FIG. 11A shows a power-supply-based DA converter 500, and FIG. 11B shows a ground-based DA converter 600. The DA converters 500 and 600 respectively have variable current sources 510 and 610 inside. The variable current source 510, 610 is controlled based on a control signal CNT to change the current that flows across a resistor R provided at the output part. This configuration allows a voltage to be applied to the resistor R to thereby generate a desired voltage level at an output terminal DACOUNT.

The variable current source 510 has a plurality of current source parts 520-1 to 520-$n$ as shown in FIG. 12A. In the variable current source 510, the current flowing across the resistor R is controlled by controlling the current source part 520-1, ..., 520-$n$ based on a control signal CNT-1, ..., CNT-n externally input. The variable current source 610 has a plurality of current source parts 620-1 to 620-$n$ as shown in FIG. 12B. In the variable current source 610, the current flowing across the resistor R is controlled by controlling the current source part 620-1, ..., 620-$n$ based on the control signal CNT-1, ..., CNT-n externally input.

The specific configuration and operation of the variable current source 510 in FIG. 12A will be described by way of example. Hereinafter, an arbitrary one in the current source parts 520-1 to 520-$n$ is called current source part 520. Further, an arbitrary one in the control signals CNT-1 to CNT-n is called control signal CNT.

The current source part 520 includes a constant current source 521, a pair of PMOS transistors 522 and 523, and an inverter circuit 524. The PMOS transistor 522, 523 has a source connected to the constant current source 521. The PMOS transistor 522 has a drain connected to a power supply Vdd, and the PMOS transistor 523 has a drain connected to the output terminal DACOUNT. In addition, the inverter circuit 524 is provided between the gates of the PMOS transistors 522, 523 to carry out contradictive control in response to the control signal CNT.

This configuration of the current source part 520 switches the PMOS transistors to be turned on from one PMOS transistor to the other according to the state of the control signal CNT. That is, when the control signal CNT has an L level, the PMOS transistor 522 is turned on, and the PMOS transistor 523 is turned off. At this time, the constant current source 521 is not connected to the output terminal DACOUNT, so that the voltage at the output terminal DACOUNT is not influenced. When the control signal CNT has an H level, on the other hand, the PMOS transistor 522 is turned off, and the PMOS transistor 523 is turned on. At this time, the constant current source 521 is connected to the output terminal DACOUNT, so that the current according to the current value of the constant current source 521 flows across the resistor R, thus lowering the voltage level of the output terminal DACOUNT.

With the above-described configuration of the variable current source 510, the current flowing across the resistor R can be controlled by controlling the current source part 520-1, ..., 520-$n$ according to the control signal CNT-1, ..., CNT-n. That is, the voltage level of the output terminal DACOUNT is lowered by increasing the number of those control signals CNT in the control signals CNT-1 to CNT-n which are to be set to an H level, and the voltage level of the output terminal DACOUNT is increased by decreasing the number of those control signals CNT which are to be set to an L level.

Such a DA converter 500, 600 can be used in, for example, a solid-state imaging device. In the solid-state imaging device, a reference voltage which changes stepwise is output from the DA converter, and compared with an analog signal read from each pixel in the pixel array section. The voltage value of the analog signal read from each pixel in the pixel array section is detected according to the comparison time, and is output as a digital value (see, for example, JP-A-2005-323331 (Patent Document 2)).

SUMMARY OF THE INVENTION

In the current-controlled DA converter 500, 600, the current flowing through the output terminal DACOUNT is changed by changing the control signal CNT.

As viewed from the current source part 520, 620, the change merely is that the destination of the current flow is the reference potential (power supply Vdd, ground GND) or the resistor R. Therefore, the current source part 520, 620 keeps supplying a constant current.

When such a current-controlled DA converter is used in the above-described solid-state imaging device, for example, a constant current is kept flowing even when there is a period where DA conversion is not needed. This leads to unnecessary power consumption.

It is therefore desirable to provide a DA converter which reduces power consumption in a period where DA conversion is not needed.

According to an embodiment of the present invention, there is provided a DA converter including a reference current generating circuit that generates a reference current, a plurality of current sources that supply currents according to the reference current, a voltage output circuit that outputs a voltage according to a current to be supplied thereto, a plurality of switch circuits provided for the current sources respectively to each switch a connection of each of the current sources to the voltage output circuit or a predetermined load, a control section that controls the plurality of switch circuits based on an input digital signal to select that of the plurality of current sources which is to be connected to the voltage output circuit, and outputs a voltage according to the digital signal from the voltage output circuit, and a switch that stops an operation of at least one of the plurality of current sources based on a control signal from the control section, without stopping an operation of the reference current generating circuit.

In the DA converter, the plurality of current sources may include a first current source with a current value according to the reference current, and a plurality of second current sources with current values proportional to the current value of the first current source, and the switch stops an operation of the first current source.

In the DA converter, the plurality of current sources may include a first current source with a current value according to the reference current, and a plurality of second current sources with current values proportional to the current value of the first current source, and the switch is provided in association with each of the second current sources to stop operations of the second current sources collectively or individually based on the control signal from the control section.

In the DA converter, the plurality of current sources may include a first current source with a current value according to the reference current, and a plurality of second current sources with current values proportional to the current value of the first current source, and the switch is provided between the first current source and the plurality of second current sources to stop operations of the second current sources collectively based on the control signal from the control section.

The foregoing DA converter may be configured to include an offset regulating current source that supplies a positive current or a negative current to the voltage output circuit to correct an offset level, and a switch that stops an operation of the offset regulating current source based on a control signal from the control section.

According to another embodiment of the invention, there is provided a solid-state imaging device including a plurality of pixels laid out in a matrix form for converting an amount of input light to an electric signal, a row scan circuit that selectively controls the plurality of pixels row by row, a DA converter that generates a reference voltage according to an input digital signal, and a plurality of AD converters that compare analog signals acquired from the pixels with the reference voltage generated by the DA converter to convert the analog signals to digital signals, wherein the DA converter includes a reference current generating circuit that generates a reference current, a plurality of current sources that supply currents according to the reference current, a voltage output circuit that outputs a voltage according to a current to be supplied thereto, a plurality of switch circuits provided for the current sources respectively to each switch a connection of each of the current sources to the voltage output circuit or a predetermined load, a control section that controls the plurality of switch circuits based on the input digital signal to select that of the plurality of current sources which is to be connected to the voltage output circuit, and outputs a voltage according to the digital signal from the voltage output circuit, and a switch that stops an operation of at least one of the plurality of current sources based on a control signal from the control section, without stopping an operation of the reference current generating circuit.

In the solid-state imaging device, the control section may control the switch to stop the operation of the current sources in a horizontal blanking period where the pixels are not selected in an operation of the row scan circuit for each row.

In the solid-state imaging device, the control section may control the switch to stop the operation of the current sources in a vertical blanking period where the digital signal is not output in an operation of the row scan circuit for each frame.

In the solid-state imaging device, the plurality of current sources may include a first current source with a current value according to the reference current, and a plurality of second current sources with current values proportional to the current value of the first current source, and the switch stops an operation of the first current source.

In the solid-state imaging device, the plurality of current sources may include a first current source with a current value according to the reference current, and a plurality of second current sources with current values proportional to the current value of the first current source, and the switch is provided in association with each of the second current sources to stop operations of the second current sources collectively or individually based on the control signal from the control section.

In the solid-state imaging devices, the plurality of current sources may include a first current source with a current value according to the reference current, and a plurality of second current sources with current values proportional to the current value of the first current source, and the switch is provided between the first current source and the plurality of second current sources to stop operations of the second current sources collectively based on the control signal from the control section.

The solid-state imaging device may be configured to include an offset regulating current source that supplies a positive current or a negative current to the voltage output circuit to correct an offset level, and a switch that stops an operation of the offset regulating current source based on a control signal from the control section.

According to the embodiments of the invention, there is provided the DA converter which reduces power consumption in a period where DA conversion is not needed, and the solid-state imaging device equipped therewith.

DESCRIPTION OF THE PREFERRED EMBODIMENTS

A DA converter according to one embodiment of the present invention, and a DA converter in a solid-state imaging device according to one embodiment of the invention each have a plurality of current sources that supply a current according to a reference current, and a voltage output circuit that outputs voltages according to the currents to be supplied from those current sources.

The DA converter further has a plurality of switch circuits provided for the respective current sources to switch the connections of the respective current sources between the voltage output circuit or a predetermined load, and a control section that controls the switch circuits based on an input digital signal.

The control section selects a current source in the plurality of current sources which is to be connected to the voltage output circuit, and causes the voltage output circuit to output a voltage according to the digital signal.

The DA converter further has a switch that stops the operation of at least one of the plurality of current sources based on a control signal from the control section.

With this configuration, the operation of at least one of the plurality of current sources can be stopped in a period where DA conversion is not needed, thus making it possible to reduce power consumption. Particularly, if all of the plurality of current sources are disabled in the period where DA conversion is not needed, the efficiency of reducing the power consumption can be improved.

The DA converter according to the embodiment has a reference current generating circuit that generates the reference current, and controls the operations of the current sources without stopping the generation of the reference current in the reference current generating circuit. This configuration can stop the operation of each current source even when the period where DA conversion is not needed is short. That is, in a case where a reference current generating circuit having a feedback loop for generating a reference current according to a reference voltage is used as the aforementioned reference current generating circuit, when the operation of the reference current generating circuit is stopped, it takes time until the operation thereof is resumed thereafter. However, the operation of the current source can be resumed quickly by controlling the operation of the current source without stopping the generation of the reference current in the reference current generating circuit.

Preferred embodiments of the invention will be described below with reference to the accompanying drawings. The description will be given in the following order.

1. First Embodiment (DA Converter)
2. Second Embodiment (Solid-state Imaging Device With DA Converter)

1. First Embodiment

First, a DA converter according to the first embodiment will be described specifically referring to FIG. 1.
(General Configuration of DA Converter)

Figure 1:
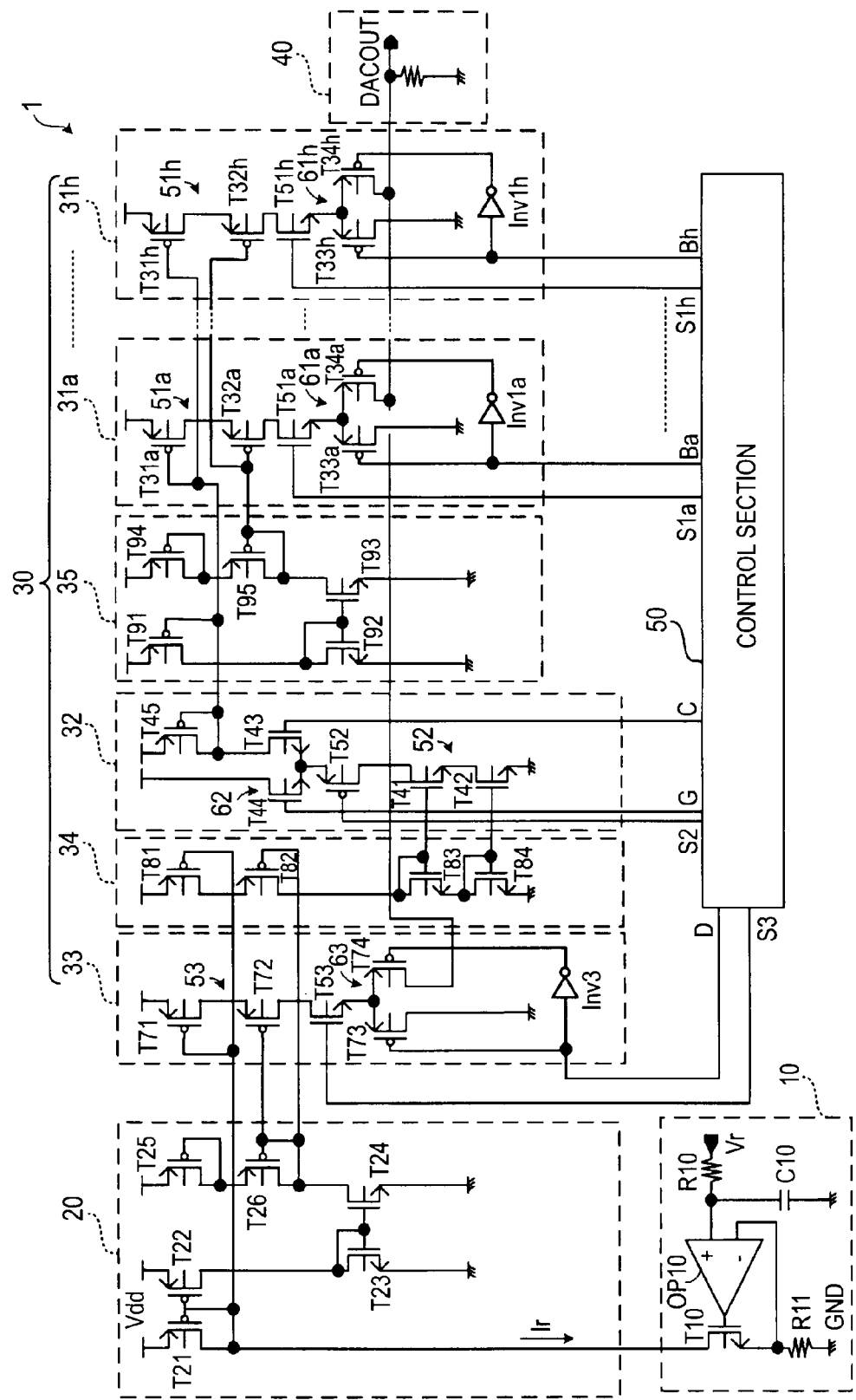
FIG. 1 is a diagram showing the configuration of a DA converter according to an embodiment of the present invention.

As shown in FIG. 1, a DA converter 1 according to the first embodiment has a reference current generating circuit 10, a current transfer circuit part 20, a current source section 30, a voltage output circuit 40, and a control section 50.

The reference current generating circuit 10 generates a reference current Ir according to an input reference voltage Vr. A current corresponding to the reference current Ir generated by the reference current generating circuit 10 is transferred to the current source section 30 via the current transfer circuit part 20. The current source section 30 has a plurality of current sources from which one current source to be connected to the voltage output circuit 40 is selected by the control section 50. The voltage output circuit 40 includes a resistor R across which the current according to the connected current source flows. The voltage output circuit 40 outputs a voltage produced across the resistor R from an output terminal DACOUNT.

An n-bit digital signal is input to the control section 50. The following description will be given on the assumption that 4-bit digital signal is input to the control section 50. The control section 50 selects a current source to be connected to the voltage output circuit 40 so that a voltage corresponding to the input digital signal is output from the output terminal DACOUNT.

The current source section 30 has eight first current source parts 31a to 31h with the same circuit configuration, a second current source part 32 for switching the gain, and a third current source part 33 for offset regulation. Those current source parts are all controlled by the control section 50. The current source section 30 further has a second current transfer part 34 provided between the current transfer circuit part 20 and the second current source part 32, and a third current transfer part 35 provided between the second current source part 32 and the first current source parts 31a to 31h. Hereinafter, one or every one of the first current source parts 31a to 31h will be referred to as "first current source part 31" whenever appropriate.

The first current source parts 31a to 31h and the third current source part 33 in the DA converter 1 according to the embodiment respectively have current sources 51a to 51h, and 53. The first current source parts 31a to 31h and the third current source part 33 further respectively have switch circuits 61a to 61h, and 63 to switch the connections of the current sources 51a to 51h, and 53 to either the voltage output circuit 40 or predetermined loads. The current source 51a, ..., 51h has a PMOS transistor T31a, ..., T31h and a PMOS transistor T32a, ..., T32h cascade-connected to each other. The current source 53 has PMOS transistors T71 and T72 cascade-connected to each other. The switch circuit 61a, ..., 61h has a PMOS transistor T33a, ..., T33h whose drain is connected to a ground GND, and a PMOS transistor T34a, ..., T34h whose drain is connected to the voltage output circuit 40. The switch circuit 63 has a PMOS transistor T73 whose drain is connected to the ground GND, and a PMOS transistor T74 whose drain is connected to the voltage output circuit 40. Hereinafter, one or every one of the current sources 51a to 51h will be referred to as "current source 51" whenever appropriate. Further, one or every one of the switch circuits 61a to 61h will be referred to as "switch circuit 61" whenever appropriate.

The second current source part 32 has a current source 52, and a switch circuit 62 which switches the current value of each of the current sources 51a to 51h of the first current source parts 31a to 31h in two levels (first current value and second current value). The current source 52 has NMOS transistors T41 and T42 cascade-connected to each other. The switch circuit 62 has an NMOS transistor T44 whose drain is connected to a power supply Vdd, and an NMOS transistor T43 whose drain is connected to the power supply via a PMOS transistor T45. In the switch circuit 62, the current value of the current source 51 becomes the first current value when the NMOS transistor T44 is turned off, and becomes the second current value when the NMOS transistor T44 is turned on.

The second current transfer part 34 permits the current source 52 to provide a current value proportional to the reference current Ir. The current transfer circuit part 20 permits the current source 53 to provide a current value proportional to the reference current Ir. The current source 51a, ..., 51h provides a current with a current value which corresponds to the states of the third current transfer part 35 and the switch circuit 62, and is proportional to the reference current Ir.

The second current source part 32 causes the switch circuit 62 to switch the current value of the current source in the first current source part 31 in two levels (first current value and second current value) under control of the control section 50. The control section 50 permits the second current source part 32 to switch the current value to the first current value when the value of the input digital signal is equal to or smaller than 7. The control section 50 permits the second current source part 32 to switch the current value to the second current value when the value of the input digital signal is equal to or greater than 8. The current value is switched to the first current value when the control section 50 outputs an L-level signal onto a gain control line G, and is switched to the second current value when the control section 50 outputs an H-level signal onto the gain control line G.

When the current value of the first current source part 31 is set to the first current value, the control section 50 controls the switch circuit 61a, ..., 61h according to the value of the input digital signal. As a result, the first current source part 31a, ..., 31h is controlled, so that a voltage corresponding to any one of 0 to 7 as the value of the digital signal is output from the output terminal DACOUNT. When the current value of the first current source part 31 is set to the second current value, likewise, the control section 50 controls the switch circuit 61a, ..., 61h according to the value of the input digital signal. As a result, the first current source part 31a, ..., 31h is controlled, so that a voltage corresponding to any one of 8 to 15 as the value of the digital signal is output from the output terminal DACOUNT. It is to be noted that the voltage to be output from the output terminal DACOUNT is changed as the control section 50 controls a control line Ba, ..., Bh respectively connected to the first current source part 31a, ..., 31h. That is, the current whose current value is the sum of the current values of the first current source parts 31 which are connected to that of the control lines Ba to Bh onto which the H-level control signal is output from the control section 50 flows across the resistor R of the voltage output circuit 40.

The third current source part 33 corrects the offset level of the output voltage produced at the output terminal DACOUNT by controlling the first current source part 31a, ..., 31h. The control section 50 controls the third current source part 33 to supply a positive current or a negative current to the voltage output circuit 40 to correct the offset level of the output voltage.

(Control to Disable Current Source)

In the DA converter 1 according to the embodiment, even when the connection of the current source 51a, ..., 51h, 53 is not set to the voltage output circuit 40 by the switch circuit 61a, ..., 61h, 63, the current source 51a, ..., 51h, 53 is connected to a predetermined load (PMOS transistor T33a, ..., T33h, T73), so that power is consumed. Likewise, power consumption occurs in the second current source part 32 too.

In case where the DA converter 1 is installed in an apparatus which involves a period where DA conversion is unnecessary, however, power is unnecessarily consumed if a constant current flows in the first current source part 31, the second current source part 32 and the third current source part 33 in the period where DA conversion is unnecessary.

In this respect, the DA converter 1 according to the embodiment is configured to be able to stop the operations of the first current source parts 31a to 31h, the second current source part 32, and the third current source part 33 in such a period to reduce power consumption.

Disabling control lines S1a to S1h are respectively connected to the first current source parts 31a to 31h. The control section 50 selects the first current source part 31 to be disabled from the first current source parts 31a to 31h, and outputs an L-level signal onto the disabling control line S1 connected to the selected first current source part 31. As a result, the operation of the selected first current source part 31 is stopped.

Each first current source part 31 has a transistor T51a, ..., T51h whose gate is connected to the disabling control line S1a, ..., S1h to stop the operation of the respective current sources 51a, ..., 51h. Hereinafter, one or every one of the transistors T51a to T51h will be referred to as "transistor T51" whenever appropriate.

Each transistor T51 is provided between the current source 51 and the switch circuit 61. The transistor T51 is controlled by the control section 50 through the disabling control line S1 to switch between the current supply from the current source 51 to the switch circuit 61 and the block of the current from the current source 51 thereto. That is, the transistor T51 functions as a switch to stop the operation of the current source 51. The operations of the current sources 51a to 51h can be stopped collectively or individually as the control section 50 controls the control signals to be output onto the disabling control lines S1a to S1h.

Likewise a disabling control line S2 is connected to the second current source part 32 whose operation is stopped as the control section 50 outputs an H-level signal to the disabling control line S2.

The second current source part 32 has a transistor T52 whose gate is connected to the disabling control line S2 to stop the operation of the current source 52. The transistor T52 is provided between the current source 52 and the switch circuit 62. The transistor T52 is controlled by the control section 50 through the disabling control line S2 to switch between the current supply from the switch circuit 62 to the current source 51 and the block of the current from the switch circuit 62 thereto. That is, the transistor T52 functions as a switch to stop the operation of the current source 52. The control section 50 can stop the operation of the current source 52 by controlling the control signal to be output onto the disabling control line S2. When the operation of the current source 52 is stopped, the operations of the current sources 51a to 51h are stopped too. Apparently, the control section 50 can stop the operations of the first current source parts 31a to 31h, and the second current source part 32 collectively by controlling the disabling control line S2.

Likewise a disabling control line S3 is connected to the third current source part 33 whose operation is stopped as the control section 50 outputs an L-level signal to the disabling control line S3.

The third current source part 33 has a transistor T53 whose gate is connected to the disabling control line S3 to stop the operation of the current source 53. The transistor T53 is provided between the current source 53 and the switch circuit 63. The transistor T53 is controlled by the control section 50 through the disabling control line S3 to switch between the current supply from the current source 53 to the switch circuit 63 and the block of the current from the current source 53 thereto. That is, the transistor T53 functions as a switch to stop the operation of the current source 53. The control section 50 can stop the operation of the current source 53 by controlling the control signal to be output onto the disabling control line 3.

The reference current generating circuit 10 keep generating the reference current Ir even when the control section 50 stops the operations of the first current source part 31, the second current source part 32 and the third current source part 33. This configuration can allow the current source part 31, 32, 33 to quickly resume its operation even when the operation stop period of the current source part 31, 32, 33 is short.

The reference current generating circuit 10 has a feedback loop formed by connecting the output terminal and inverting input terminal (−) of an operation amplifier OP10 connected together via the gate and source of an NMOS transistor T10. The reference voltage Vr is input to the non-inverting input terminal (+) of the operation amplifier OP10, so that the operation amplifier OP10 controls the voltage to be output from the output terminal DACOUNT in such a way that the voltage which is produced across the resistor R becomes the reference voltage Vr. Accordingly, the reference current generating circuit 10 generates the reference current Ir ($\approx$Vr/R11) according to the reference voltage Vr. A resistor R10 and a capacitor C10 are a filter for reducing nose in the reference voltage Vr to be input to the non-inverting input terminal (+) of the operation amplifier OP10.

The reference current generating circuit 10 has the feedback loop formed in the above manner. Therefore, if the voltage to be input to the reference current generating circuit 10 is set to 0 V to stop generating the reference current Ir from the reference current generating circuit 10, and then is set to the reference voltage Vr, for example, it takes time to generate the desired reference current Ir due to the feedback control.

In this respect, as described above, the DA converter 1 according to the embodiment is configured to keep operating the reference current generating circuit 10 even when the operation of the current source part 31, 32, 33 is stopped.

(Other Circuit Configurations)

The current transfer circuit part 20 is provided to suppress the influence of the stopped operation of the third current source part 33 on the reference current Ir.

The current transfer circuit part 20 has a pair of current-mirror-connected PMOS transistors T21 and T22, and a pair of current-mirror-connected NMOS transistors T23 and T24. The current transfer circuit part 20 also has cascade-connected PMOS transistors T25 and T26. The drain of the PMOS transistor T22 is connected to the drain of the NMOS transistor T23. The drain of the NMOS transistor T24 is connected to the drain of the PMOS transistor T26. The PMOS transistor T26 is current-mirror-connected to a PMOS transistor T72 of the third current source part 33 via a plurality of current mirror circuits of the current transfer circuit part 20. The PMOS transistor T21 is current-mirror-connected to a PMOS transistor T71. Accordingly, the cascade-connected PMOS transistors T71 and T72 serve as the current source 53 with the current value corresponding to the reference current Ir.

The second current transfer part 34 is provided to suppress the influence of the stopped operation of the second current source part 32 on the reference current Ir.

The second current transfer part 34 has a current source configured by cascade-connection of a PMOS transistor T81 current-mirror-connected to the PMOS transistor T21, and a PMOS transistor T82 current-mirror-connected to the PMOS transistor T26. The second current transfer part 34 also has cascade-connected NMOS transistors T83 and T84. The NMOS transistors T83 and T84 are respectively current-mirror-connected to the NMOS transistors T41 and T42 cascade-connected in the second current source part 32. Accordingly, the cascade-connected NMOS transistors T41 and T42 serve as the current source 52 with the current value corresponding to the reference current Ir.

The third current transfer part 35 is provided to suppress the influence of the stopped operation of the first current source part 31 on the second current source part 32.

The third current transfer part 35 has a PMOS transistor T91 current-mirror-connected to the PMOS transistor T44, and a pair of cascade-connected NMOS transistors T92 and T93. The third current transfer part 35 also has cascade-connected PMOS transistors T94 and T95. The drain of the PMOS transistor T91 is connected to the drain of the NMOS transistor T92. The drain of the NMOS transistor T93 is connected to the drain of the PMOS transistor T95. The PMOS transistor T95 is current-mirror-connected to the PMOS transistors T32a to T32h of the first current source parts 31a to 31h via a plurality of current mirror circuits of the third current transfer part 35. The PMOS transistor T45 of the second current source part 32 is current-mirror-connected to the PMOS transistors T31a to T31h of the first current source parts 31a to 31h. Accordingly, the cascade-connected PMOS transistors T31a to T31h, T32a to T32h serve as the current sources with the current value corresponding to the first current value or second current value.

Although the foregoing DA converter 1 is configured to have the NMOS transistor T51, T53 provided between the current source 51, 53 and the switch circuit 61, 63 as a switch to disable the current source part 31, 33, the current source part 31, 33 may be disabled by other methods.

Figure 2A:
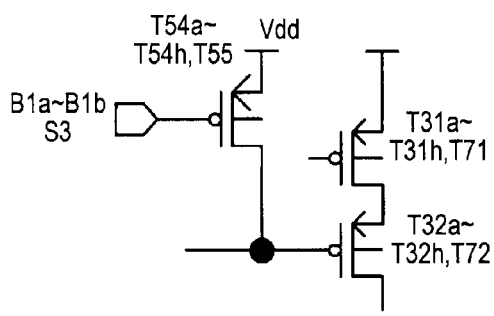
FIGS. 2A and 2B are diagrams showing different examples of a switch that disables a current source.

As shown in FIG. 2A, for example, PMOS transistors T54a to T54h, and T55 may be provided to connect the gates of the PMOS transistors T32a to T32h, and T72 respectively constituting the current sources 51 and 53 to the power supply Vdd. In this case, the PMOS transistors T54a to T54h, and T55 serve as switches to disable the current sources 51 and 53.

Figure 3A:
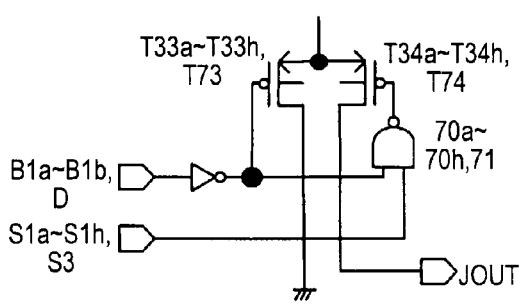
FIGS. 3A and 3B are diagrams showing further examples of the switch that disables a current source.

As shown in FIG. 3A, NAND circuits 70a to 70h, and 71 may be provided to simultaneously stop the operations of both of the two PMOS transistors (T33a, ..., T33h, T73 and T34a, ..., T34h, T74) respectively constituting the switch circuits 61 and 63. In this case, the two PMOS transistors (T33a, ..., T33h, T73 and T34a, ..., T34h, T74) respectively constituting the switch circuits 61 and 63 serve as switches to disable the current sources 51 and 53.

Although the foregoing DA converter 1 is configured to have the PMOS transistor T52 provided between the current source 52 and the switch circuit 62 as a switch to disable the second current source part 32, the second current source part 32 may be disabled by other methods.

Figure 2B:
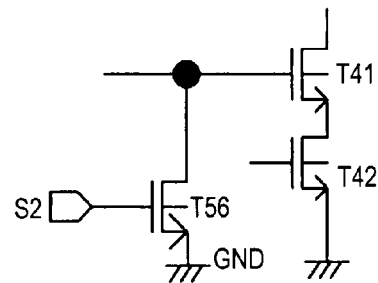

As shown in FIG. 2B, for example, an NMOS transistor T56 may be provided to connect the gate of the NMOS transistor T41 constituting the current source 52 to the ground GND. In this case, the NMOS transistor T56 serves as a switch to disable the current source 52.

Figure 3B:
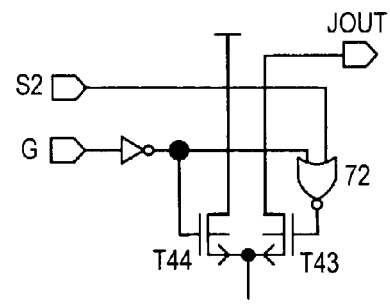

As shown in FIG. 3B, a NOR circuit 72 may be provided to simultaneously stop the operations of both of the two NMOS transistors T43 and T44 constituting the switch circuit 62. In this case, the two NMOS transistors T43 and T44 constituting the switch circuit 62 serve as a switch to disable the current source 52.

Figure 4A:
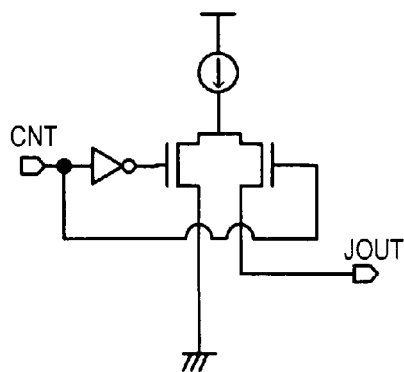
FIGS. 4A and 4B are diagrams showing different examples of a current source.
Figure 4B:
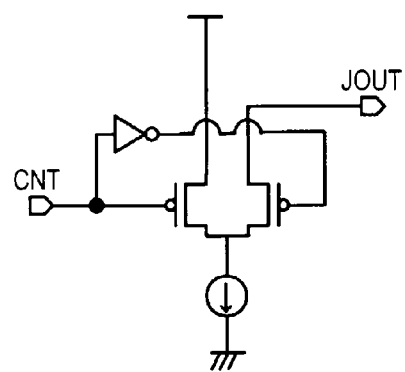

Although the foregoing description of the DA converter 1 has been given of the case where the current source 51, 53 of the current source part 31, 33 is a ground-based type current source as shown in FIG. 4A, a power-supply-based current source as shown in FIG. 4B may be used as well. Although the current source 52 of the current source part 32 has been described as the power-supply-based current source as shown in FIG. 4B, the ground-based type current source as shown in FIG. 4A may be used as well.

Figure 5:
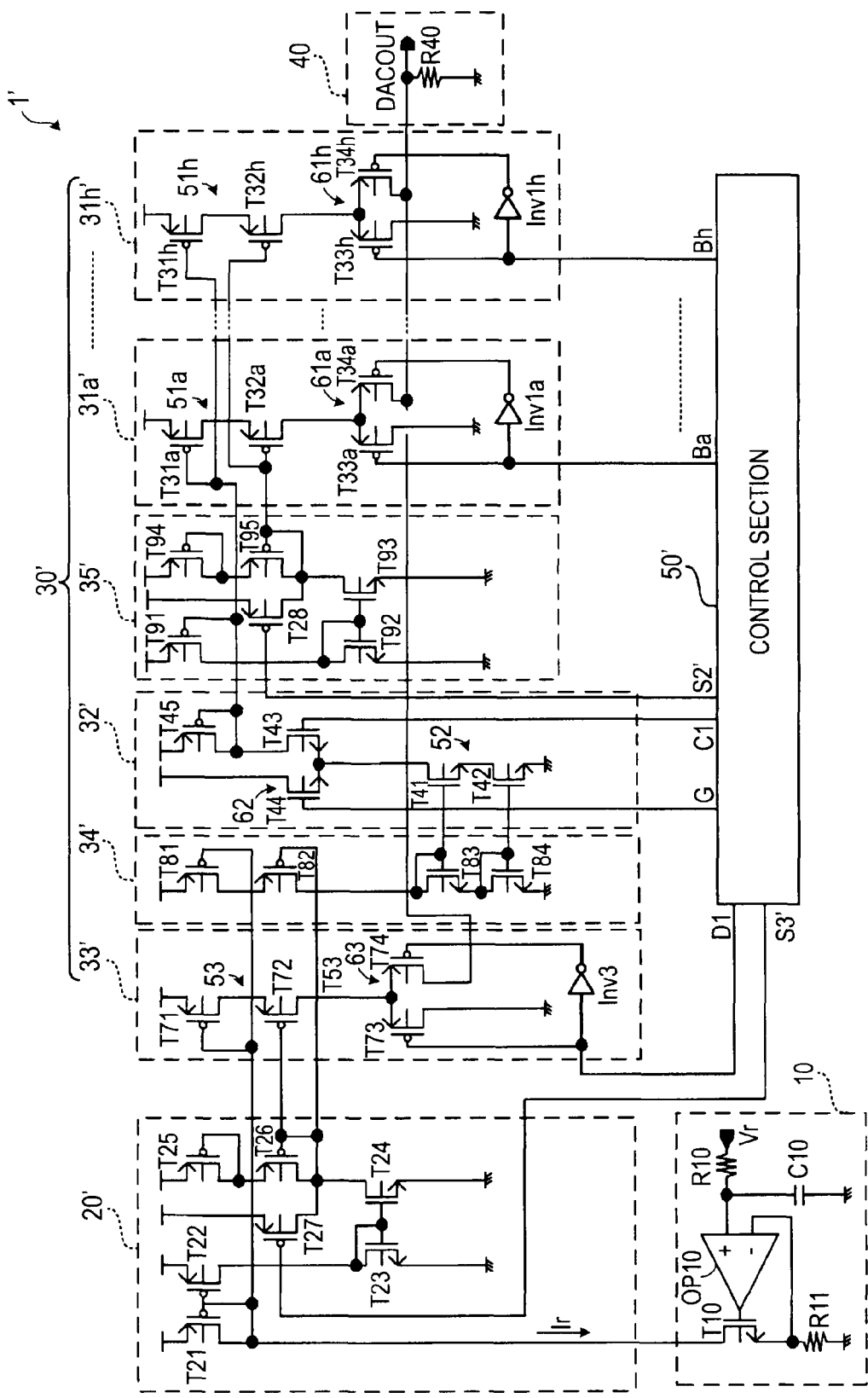
FIG. 5 is a diagram showing another configuration of the DA converter according to the embodiment of the invention.

Further, the switch to disable the current source 51, 52, 53 is provided in each current source part 31, 32, 33 in the foregoing DA converter 1, which is not restrictive. As in a DA converter 1' as shown in FIG. 5, for example, the current source 51, 52, 53 of a current source part 31', 32', 33' may be disabled by stopping the operation of a second current transfer part 34' or a third current transfer part 35'.

In this case, a PMOS transistor T27 may be provided to connect the gate of the PMOS transistor T82 constituting the current source in the second current transfer part 34' to the power supply Vdd. In this case, the PMOS transistor T27 serves as a switch to collectively disable the current sources 51 to 53.

In this case, a PMOS transistor T28 may be provided to connect the gate of the PMOS transistor T95 constituting the current source in the third current transfer part 35' to the power supply Vdd. In this case, the PMOS transistor T28 serves as a switch to collectively disable the current sources 51a to 51h.

Furthermore, the switches to stop the operations of the current source parts 31, 32, 33 are provided therein in the foregoing DA converter 1, which is not restrictive. For example, the switch to disable the first current source part 31 may not be provided, and the first current source part 31 and the second current source part 32 may be disabled simultaneously only by the switch to stop the operation of the second current source part 32.

2. Second Embodiment

Next, a solid-state imaging device according to the second embodiment will be described specifically referring to FIG. 6. This solid-state imaging device is a CMOS image sensor to which the DA converter according to the first embodiment is adapted.

Figure 6:
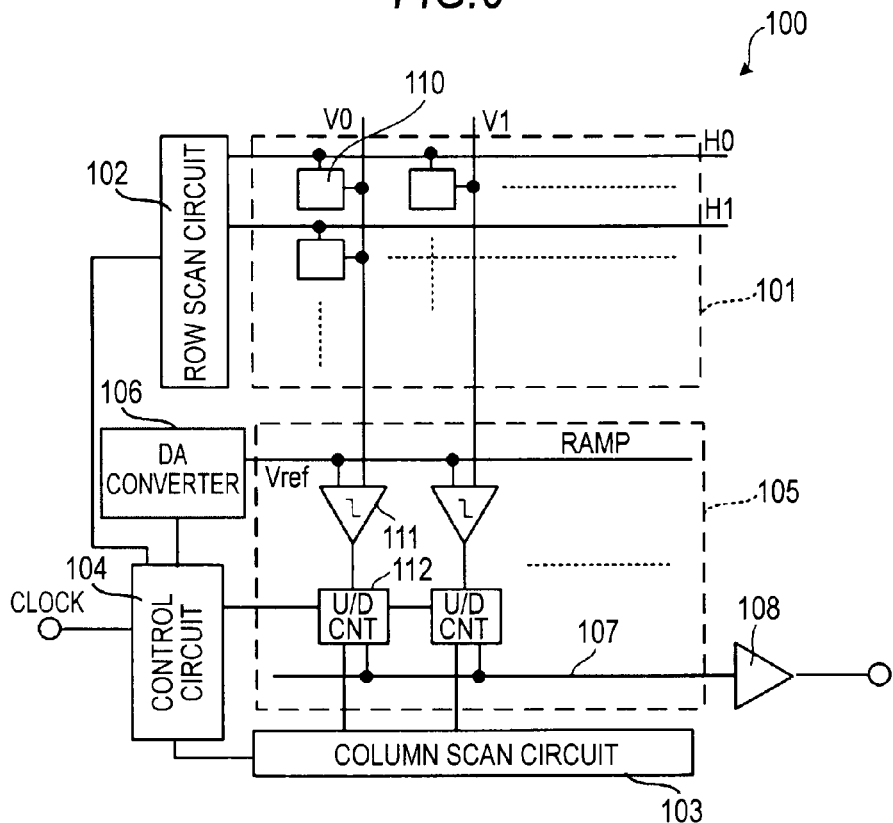
FIG. 6 is a diagram showing the configuration of a solid-state imaging device according to an embodiment of the invention.

As shown in FIG. 6, a solid-state imaging device 100 has a pixel array section 101 as an imaging section, a row scan circuit 102, a column scan circuit 103, a control circuit 104, an ADC group 105, a DA converter 106, a horizontal output line 107, and an output amplifier 108. The DA converter 106 has the same configuration as the DA converter according to the first embodiment.

The pixel array section 101 has a two-dimensional array of unit pixels 110 each of which converts the amount of the input light to an electric signal. The unit pixel 110 is provided with a photodiode to perform photoelectric conversion, a transfer transistor to read a signal charge generated by the photodiode, and an amplification transistor to convert the read signal charge to a pixel signal.

The row scan circuit 102 selectively controls a plurality of unit pixels 110 for each row H0, H1, or the like. That is, the transfer transistors of the individual unit pixels 110 are controlled by the row scan circuit 102, so that the pixel signals generated by the unit pixels 110 are output to the ADC group 105 from column lines Vx (V0, V1, . . . ) provided for the respective columns.

The ADC group 105 has AD converters provided in association with the respective columns of the pixel array section 101 and each having a comparator 111 and an UD counter 112. The comparator 111 compares a reference voltage Vref output from the DA converter 106 with the pixel signal, and outputs the comparison result to the UD counter 112. Under control of the control circuit 104 and the column scan circuit 103, the UD counter 112 counts the output from the comparator 111, and outputs the count value as a digital signal to the output amplifier 108 via the horizontal output line 107. The DA converter 106 outputs a voltage corresponding to the digital signal input from the control circuit 104 as the reference voltage Vref.

The operation of the solid-state imaging device 100 will be described below.

After the first signal reading from the unit pixels 110 of an arbitrary row Hx (H0, H1, . . . ) to the column line Vx is stabilized, the solid-state imaging device 100 inputs a step-like waveform RAMP, obtained by changing the reference voltage Vref with time, to the comparator 111 from the DA converter 106. As a result, the voltage of the column line Vx is compared with the reference voltage Vref with the waveform RAMP.

In the operational sequence, the UD counter 112 starts the first counting at the same time the input of the reference voltage Vref with the step-like waveform RAMP is started. At this time, the UD counter 112 performs down-counting. When the reference voltage Vref with the waveform RAMP becomes equal to the voltage of the column line Vx, the output of the comparator 111 is inverted, and at the same time, a count value corresponding to the comparison period is stored in a memory provided in the UD counter 112.

At the time of the first signal reading, a reset component ΔVreset of the unit pixel 110 is read out. The reset component ΔVreset contains noise which varies from one unit pixel 110 to another as an offset. Since the reset level is common to all the pixels, and the variation in ΔVreset is generally known to be small, the comparison period can be made shorter by adjusting the reference voltage Vref with the waveform RAMP at the time of the first reading of ΔVreset.

Next, in the second signal reading, a signal component according to the amount of the input light for each unit pixel 110 in addition to ΔVreset is read out, and an operation similar to that in the first signal reading is carried out. That is, after the second signal reading from the unit pixels 110 of an arbitrary row Hx to the column line Vx is stabilized, a step-like waveform RAMP, obtained by changing the reference voltage Vref with time by the DA converter 106, is input to the comparator 111 to be compared with the voltage of the column line Vx therein. The UD counter 112 starts the second counting at the same time the input of the reference voltage Vref with the step-like waveform RAMP is started.

At this time, the UD counter 112 performs up-counting. When the reference voltage Vref with the waveform RAMP becomes equal to the voltage of the column line Vx in an arbitrary comparator 111, the output of the comparator 111 is inverted, and at the same time, a count value corresponding to the comparison period is stored in the memory provided in the UD counter 112.

In the sequence of operations, the count is held at the same location in the memory in the first counting and the second counting, and output value after the second counting represents the pure signal quantity free of the noise component.

After the foregoing AD conversion, an n-bit digital signal held in the memory is output outside via the horizontal output line 107 by the column scan circuit 103. Thereafter, a similar operation is repeated row by row to generate a two-dimensional image.

Figure 7:
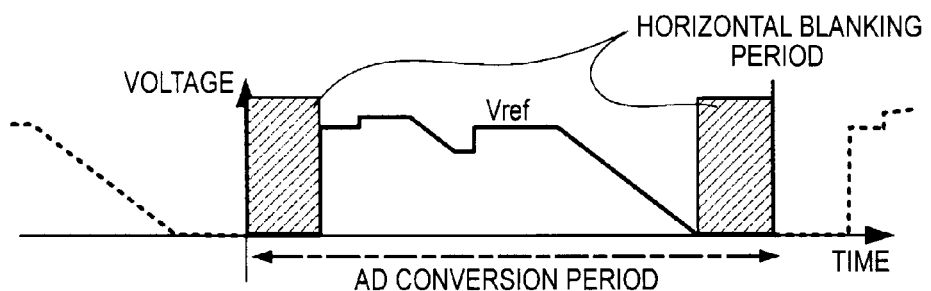
FIG. 7 is an explanatory diagram of an AD conversion period.
Figure 8:
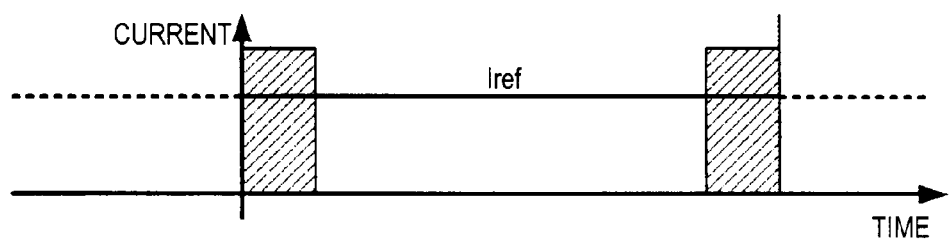
FIG. 8 is an explanatory diagram of a period in which the operation of a current source is stopped.

Pixel signals are output from the pixel array section 101 line by line. Then, every time pixel signals are output from the pixel array section 101 line by line, there is a period where pixel signals are not output as shown in FIG. 7. This period is generally called "horizontal blanking period".

In the horizontal blanking period, therefore, it is not necessary to output the reference voltage Vref from the DA converter 106. However, mere switching of the connection of the switch circuit 61, 62, 63 (see FIG. 1) as described above causes the current source 51, 52, 53 to keep operating, so that power is kept consumed.

Figure 9:
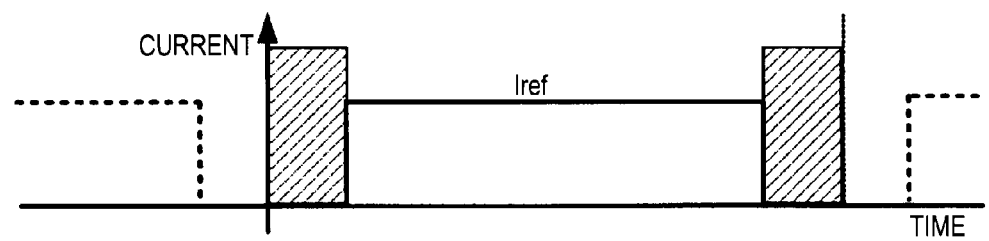
FIG. 9 is an explanatory diagram of a period in which the operation of a current source is stopped.

To cope with the situation, therefore, the solid-state imaging device 100 according to the embodiment is configured to stop the operation of the current source 51, 52, 53 in the DA converter 106 in the horizontal blanking period as shown in FIG. 9. Specifically, the control circuit 104 controls the DA converter 106 to stop the operation of the current source 51, 52, 53. It is to be noted that the control circuit 104 can be configured not to disable the current source 52 of the DA converter 106. This modification can quicken the initiation of the operation when the stop of the operation of the current source 51 is released.

Figure 10:
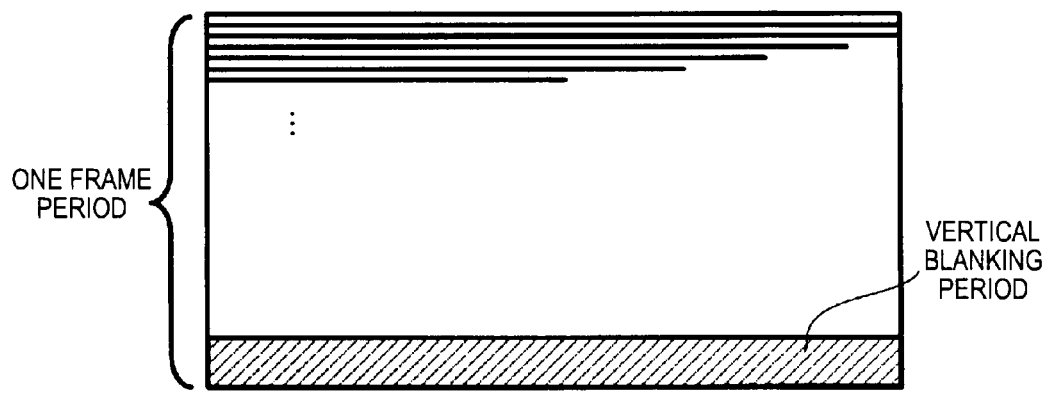
FIG. 10 is an explanatory diagram of an AD conversion period.
Figure 11A:
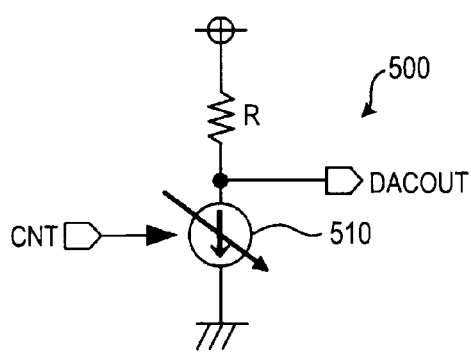
FIGS. 11A and 11B are simple circuit diagrams of current-controlled DA converters according to related arts.
Figure 11B:
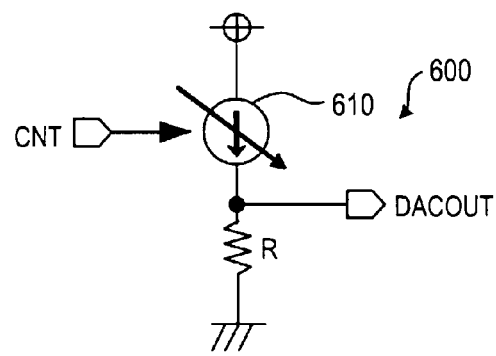
Figure 12A:
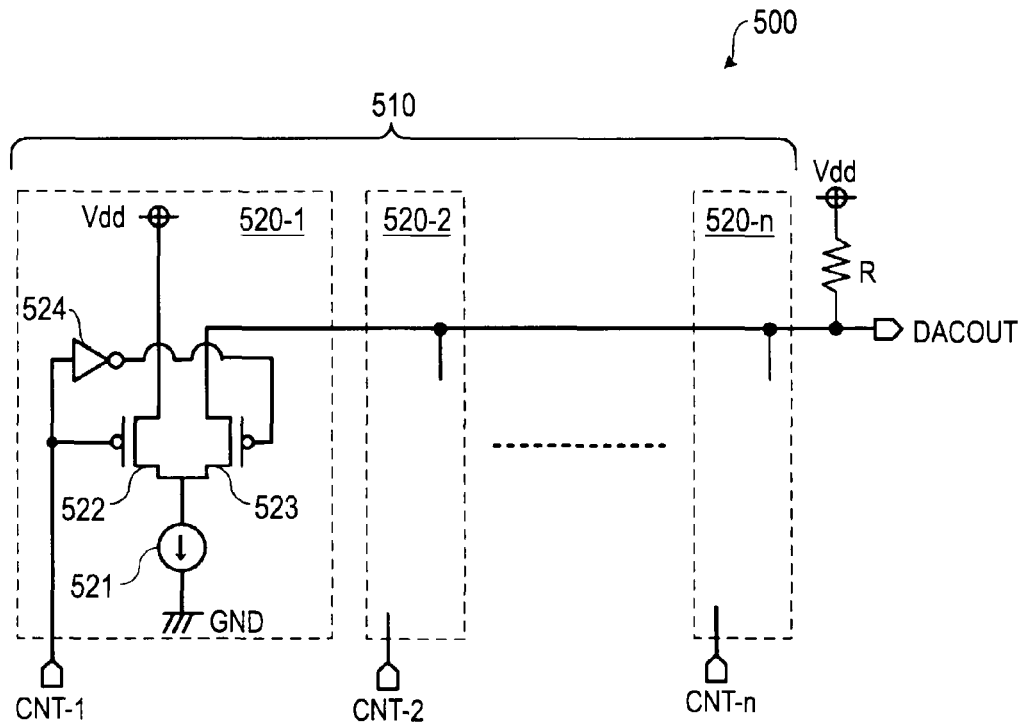
FIGS. 12A and 12B are configurational diagrams of current-controlled DA converters.
Figure 12B:
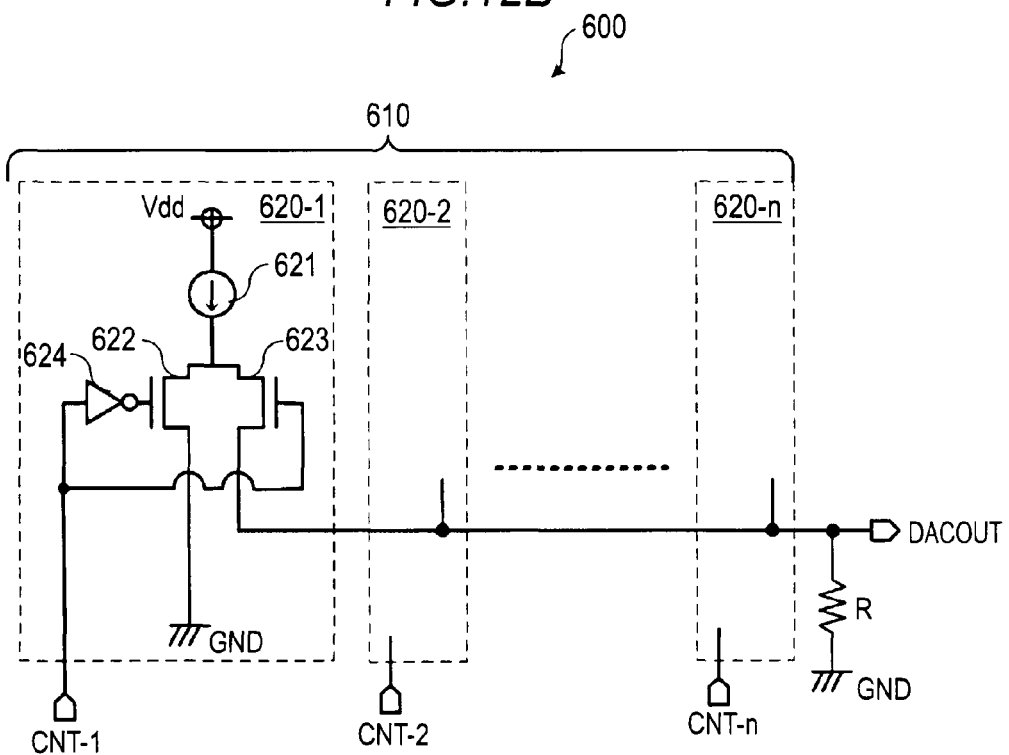

After one frame of pixel signals is output from the pixel array section 101, there is a period where pixel signals are not output as shown in FIG. 10. This period is generally called "vertical blanking period".

In the vertical blanking period, therefore, it is not necessary to output the reference voltage Vref from the DA converter 106.

In this respect, therefore, the solid-state imaging device 100 according to the embodiment is configured to stop the operation of the current source 51, 52, 53 in the DA converter 106 in the vertical blanking period. Specifically, the control circuit 104 controls the DA converter 106 to stop the operation of the current source 51, 52, 53. It is to be noted that the control circuit 104 can be configured not to disable the current source 52 of the DA converter 106. This modification can quicken the initiation of the operation when the stop of the operation of the current source 51 is released.

Because the solid-state imaging device 100 according to the embodiment stops the operation of the current source 51, 52, 53 in the DA converter 106 in the period where AD conversion is not needed, power consumption can be reduced.

The present application contains subject matter related to that disclosed in Japanese Priority Patent Application JP 2009-198869 filed in the Japan Patent Office on Aug. 28, 2009, the entire contents of which is hereby incorporated by reference.

It should be understood by those skilled in the art that various modifications, combinations, sub-combinations and alterations may occur depending on design requirements and other factors insofar as they are within the scope of the appended claims or the equivalents thereof.

What is claimed is:

1. A digital-analog (DA) converter comprising:
a reference current generating circuit that generates a reference current;
a plurality of current sources that supply currents according to the reference current;
a voltage output circuit that outputs a voltage according to a current to be supplied thereto;
a plurality of switch circuits provided for the current sources respectively to each switch a connection of each of the current sources to the voltage output circuit or a predetermined load;
a control section that controls the plurality of switch circuits based on an input digital signal to select that of the plurality of current sources which is to be connected to the voltage output circuit, and outputs a voltage according to the digital signal from the voltage output circuit;
a switch, different from the plurality of switch circuits, that stops an operation of one of the plurality of current sources based on a control signal from the control section, without stopping an operation of the reference current generating circuit, said switch being electrically disposed between the one of the plurality of current sources and a corresponding one of the plurality of switch circuits;
a current transfer circuit electrically disposed between the voltage output circuit and the reference current generating circuit that suppresses an influence of the stop of the operation of the one of the plurality of current sources on the reference current or another of the plurality of current sources;
an offset regulating current source that supplies a positive current or a negative current to the voltage output circuit to correct an offset level; and
a switch that stops an operation of the offset regulating current source based on a control signal from the control section, wherein
the plurality of current sources include a first current source with a current value according to the reference current, and a plurality of second current sources with current values proportional to the current value of the first current source,
the switch stops an operation of the first current source,
the current transfer circuit includes a first current transfer circuit electrically disposed between the first current source and the reference current generating circuit that suppresses the influence of the stop of the first current source on the reference current, and
the current transfer circuit includes a second current transfer circuit electrically disposed between the offset regulating current source and the reference current generating circuit that suppresses the influence of the stop of an operation of the offset regulating current source on the reference current.

2. The DA converter according to claim 1, wherein the DA converter further includes
a switch in association with each of the second current sources to stop operations of the second current sources collectively or individually based on the control signal from the control section.

3. The DA converter according to claim 1, wherein the DA converter further includes
a switch between the first current source and the plurality of second current sources to stop operations of the second current sources collectively based on the control signal from the control section.

4. A solid-state imaging device comprising:
a plurality of pixels laid out in a matrix form for converting an amount of input light to an electric signal;
a row scan circuit that selectively controls the plurality of pixels row by row;
a digital-analog (DA) converter that generates a reference voltage according to an input digital signal; and
a plurality of AD converters that compare analog signals acquired from the pixels with the reference voltage generated by the DA converter to convert the analog signals to digital signals,
the DA converter including
a reference current generating circuit that generates a reference current,
a plurality of current sources that supply currents according to the reference current,
a voltage output circuit that outputs a voltage according to a current to be supplied thereto,
a plurality of switch circuits provided for the current sources respectively to each switch a connection of each of the current sources to the voltage output circuit or a predetermined load,
a control section that controls the plurality of switch circuits based on the input digital signal to select that of the plurality of current sources which is to be connected to the voltage output circuit, and outputs a voltage according to the digital signal from the voltage output circuit,
a switch, different from the plurality of switch circuits, that stops an operation of one of the plurality of current sources based on a control signal from the control section, without stopping an operation of the reference current generating circuit, said switch being electrically disposed between the one of the plurality of current sources and a corresponding one of the plurality of switch circuits,
a current transfer circuit electrically disposed between the voltage output circuit and the reference current generating circuit that suppresses an influence of the stop of the operation of the one of the plurality of current sources on the reference current or another of the plurality of current sources,
an offset regulating current source that supplies a positive current or a negative current to the voltage output circuit to correct an offset level, and a switch that stops an operation of the offset regulating current source based on a control signal from the control section, wherein the plurality of current sources include a first current source with a current value according to the reference current, and a plurality of second current sources with current values proportional to the current value of the first current source, the switch stops an operation of the first current source, the current transfer circuit includes a first current transfer circuit electrically disposed between the first current source and the reference current generating circuit that suppresses the influence of the stop of the first current source on the reference current, and the current transfer circuit includes a second current transfer circuit electrically disposed between the offset regulating current source and the reference current generating circuit that suppresses the influence of the stop of an operation of the offset regulating current source on the reference current.

5. The solid-state imaging device according to claim 4, wherein the control section controls the switch to stop the operation of the one of the plurality of current sources in a horizontal blanking period where the pixels are not selected in an operation of the row scan circuit.

6. The solid-state imaging device according to claim 4 or 5, wherein the control section controls the switch to stop the operation of the one of the plurality of current sources in a vertical blanking period where the digital signal is not output in an operation of the row scan circuit.

7. The solid-state imaging device according to claim 4, wherein the DA converter further includes a switch in association with each of the second current sources to stop operations of the second current sources collectively or individually based on the control signal from the control section.

8. The solid-state imaging device according to claim 4, wherein the DA converter further includes a switch between the first current source and the plurality of second current sources to stop operations of the second current sources collectively based on the control signal from the control section.

9. The DA converter according to claim 1, wherein the second current transfer circuit is electrically disposed between the first current source and the plurality of second current sources and suppresses the influence of the stop of the operation of at least one of the plurality of second current sources on the first current source.

10. The DA converter according to claim 9, further comprising:

wherein the current transfer circuit includes a third current transfer circuit electrically disposed between the offset regulating current source and the reference current generating circuit that suppresses the influence of a stop of an operation of the offset regulating current source on the reference current.

\* \* \* \* \*